United States Patent
Shin et al.

(10) Patent No.: US 7,663,302 B2
(45) Date of Patent: Feb. 16, 2010

(54) ORGANIC LIGHT EMITTING DISPLAY (OLED) AND ITS METHOD OF FABRICATION

(75) Inventors: Hyun Soo Shin, Yongin-si (KR); Jae Kyeong Jeong, Yongin-si (KR); Yeon Gon Mo, Yongin-si (KR); Dong Un Jin, Yongin-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 343 days.

(21) Appl. No.: 11/493,576

(22) Filed: Jul. 27, 2006

(65) Prior Publication Data
US 2007/0024187 A1    Feb. 1, 2007

(30) Foreign Application Priority Data
Jul. 28, 2005    (KR) .................. 10-2005-0069173

(51) Int. Cl.
*H05B 33/00* (2006.01)
(52) U.S. Cl. .............. 313/504; 313/506; 313/112; 313/499; 445/23
(58) Field of Classification Search .............. None
See application file for complete search history.

(56) References Cited

U.S. PATENT DOCUMENTS

| | | | |
|---|---|---|---|
| 3,208,860 A * | 9/1965 | Armistead et al. ......... 501/13 |
| 5,256,601 A | 10/1993 | Kerko et al. |
| 5,909,081 A * | 6/1999 | Eida et al. .................. 313/504 |
| 5,965,981 A | 10/1999 | Inoguchi et al. |
| 7,309,531 B2 * | 12/2007 | Suzuki et al. ............... 428/690 |
| 2004/0155846 A1 | 8/2004 | Hoffman et al. |
| 2004/0263056 A1 * | 12/2004 | Seo et al. .................... 313/500 |

FOREIGN PATENT DOCUMENTS

| KR | 10-2004-0106576 | 12/2004 |
|---|---|---|
| WO | WO 98/30923 | 7/1998 |
| WO | WO 03/001555 | 1/2003 |

OTHER PUBLICATIONS

European Search Report for Korean Patent Application No. 2005-0069173 issued on Dec. 4, 2006. (Submitted in an Information Disclosure Statement filed on Dec. 11, 2006).

* cited by examiner

*Primary Examiner*—Ashok Patel
(74) *Attorney, Agent, or Firm*—Robert E. Bushnell, Esq.

(57) ABSTRACT

An Organic Light Emitting Display (OLED) and its method of fabrication includes: a transparent substrate; a photochromatic layer formed on a first surface of the transparent substrate; at least one transparent Thin Film Transistor (TFT) formed on a first surface of the transparent substrate, and an organic light emitting device formed on and electrically connected to the transparent TFT.

18 Claims, 3 Drawing Sheets

ORGANIC LIGHT EMITTING DISPLAY (OLED) AND ITS METHOD OF FABRICATION

CLAIM OF PRIORITY

This application makes reference to, incorporates the same herein, and claims all benefits accruing under 35 U.S.C. §119 from an application for ORGANIC LIGHT EMITTING DISPLAY AND FABRICATION METHOD FOR THE SAME earlier filed in the Korean Intellectual Property Office on the 28$^{th}$ of Jul. 2005 and there duly assigned Ser. No.10-2005-0069173.

BACKGROUND OF THE INVENTION

1. Field of the Invention

The present invention relates to an Organic Light Emitting Display (OLED) and its method of fabrication, and more particularly, to an OLED and its method of fabrication in which a photochromatic layer is formed on a first surface of a transparent substrate of an OLED so that it is possible to realize a light emitting display of high visibility and contrast even when intense external light is incident.

2. Description of the Related Art

An OLED is formed of uniform and flat thin films. Also, in the OLED, an electrode that emits light is formed of a transparent conductive thin film and the opposite electrode is formed of aluminum or another heat resistant metal. Since the metal thin films have a high reflectivity, when intense light (light emitted from a strong light source, such as solar rays) is directly incident from an external light source, the clarity of a screen deteriorates.

Therefore, in order to prevent the displayed image from deteriorating due to the reflection of external light, a reflection preventing film is formed on the surface of or inside the display. According to such a technology, for example, in OLEDs of common and charged structures, a diamond like carbon thin film of low reflectivity is formed between a metal electrode film and an insulating film, between an insulating film and a fluorescent film, or between a metal conductive film and a fluorescent film so that it is possible to minimize reflection of the external light from the metal electrodes and to thus increase the efficiency of electrons irradiated into the fluorescent film.

As described above, when a reflection preventing layer is inserted in order to prevent the external light from being reflected from the metal thin films, it is possible to see a clear image under an intense external light source. However, when the external light source does not exist, the reflection preventing layer is not required. However, the reflection preventing layer is still present so that the emission efficiency of the OLED is reduced.

SUMMARY OF THE INVENTION

Accordingly, it is an object of the present invention to provide an Organic Light Emitting Display (OLED) and its method of fabrication in which a photochromatic layer is formed on a first surface of a transparent substrate of the OLED so that it is possible to realize a light emitting display of high visibility and contrast even when intense external light is incident.

In order to achieve the foregoing and/or other aspects of the present invention, an Organic Light Emitting Display (OLED) is provided including: a transparent substrate; a photochromatic layer arranged on a first surface of the transparent substrate; at least one transparent Thin Film Transistor (TFT) arranged on a second surface of the transparent substrate; and an organic light emitting device arranged on and electrically connected to the transparent TFT.

The photochromatic layer preferably includes at least one of an inorganic material, an organic material, and a glass material that visibly changes in response to light. The photochromatic layer preferably includes a borosilicate containing either Ag or halogen compound crystals. The color of the photochromatic layer preferably changes in response to being exposed to either light or UV rays.

The transparent TFT preferably includes a semiconductor layer, a gate electrode, and source and drain electrodes.

The semiconductor layer preferably includes a material having a wide band gap of at least 3.0 eV. The semiconductor layer preferably includes one of: an oxide, including ZnO, ZnSnO, CdSnO, GaSnO, TlSnO, InGaZnO, CuAlO, SrCuO or LaCuOS; a nitride including GaN, InGaN, AlGaN or InGaAlN; a carbide including SiC; and diamond.

The gate electrode and the source and drain electrode preferably include one of Indium Tin Oxide (ITO), Indium Zinc Oxide (IZO) and Indium Tin Zinc Oxide (ITZO).

The organic light emitting device preferably includes a first electrode layer, an emission layer and a second electrode layer. The first electrode layer and the second electrode layer preferably include transparent electrodes. The first electrode layer and the second electrode layer preferably include one of ITO, IZO and ITZO.

The organic light emitting device preferably effects two sided emission.

In order to also achieve the foregoing and/or other aspects of the present invention, a method of fabricating an Organic Light Emitting Display (OLED) is provided, the method including: forming a photochromatic layer on a first surface of a transparent substrate; forming at least one transparent Thin Film Transistor (TFT) on a second surface of the transparent substrate; and forming an organic light emitting device on the transparent TFT and electrically connecting the organic light emitting device to the transparent TFT.

The photochromatic layer is preferably formed by a sol-gel method.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Hereinafter, exemplary embodiments of the present invention are described in detail with reference to the attached drawings.

Figure 1:
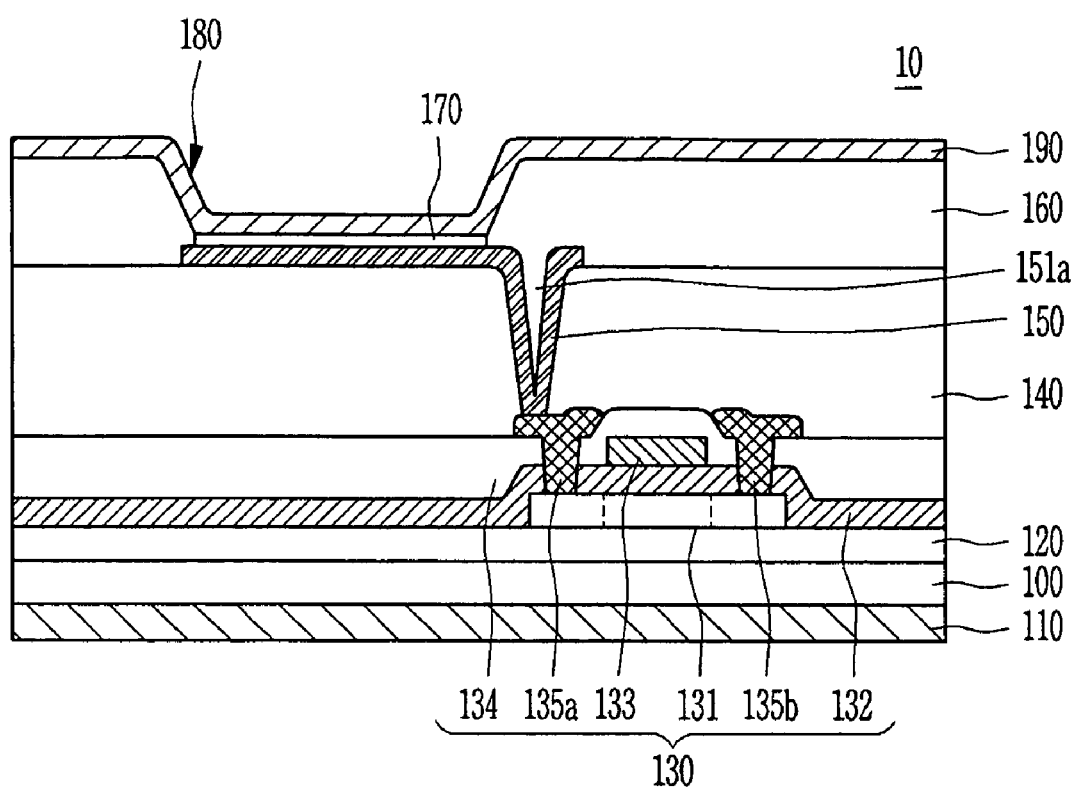
FIG. 1 is a schematic sectional view of an Organic Light Emitting Display (OLED) according to a first embodiment of the present invention.

FIG. 1 is a schematic sectional view of an Organic Light Emitting Display (OLED) according to a first embodiment of the present invention.

Referring to FIG. 1, an OLED 10 includes a transparent substrate 100, a photochromatic layer 110 formed on a first surface of the transparent substrate 100, at least one transparent Thin Film Transistor (TFT) 130 formed on a second surface of the transparent substrate 100, and an organic light emitting device formed on and electrically connected to the transparent TFT 130.

The transparent substrate 100 can be formed of an insulating material, such as glass, plastic, silicon, or a synthetic resin, and is preferably a transparent substrate, such as a glass substrate.

The photochromatic layer 110 is formed on a first surface of the transparent substrate 100 of at least one of an inorganic, an organic, or a glass material that visibly changes by light. In particular, the photochromatic layer 110 is preferably formed of a borosilicate containing Ag or halogen compound crystals. When the photochromatic layer 110 is exposed to light or UV rays, the $Cl^-$ ions of the Ag or halogen compound crystals are emitted as electrons so that the emitted electrons reduces $Ag^+$ to change $Cl^-$ and $Ag^+$ into Cl and Ag in a neutral state. Therefore, the photochromatic layer 110 becomes opaque to operate as a black matrix.

The buffer layer 120 is formed on the transparent substrate 100 of a transparent insulating material, such as a nitride film or an oxide film. However, the present invention is not limited to the above.

The transparent TFT 130 is formed on the buffer layer 120.

Hereinafter, the transparent TFT 130 is described in detail. A transparent semiconductor layer 131 of the transparent TFT 130 is formed on the buffer layer 120 in a predetermined pattern. The transparent semiconductor layer 131 can be formed of at least one conductive metal material selected from the group consisting of ZnO, ZnSnO, GaSnO, GaN, and SiC that are wide band gap materials whose band gap is no less than 3.0 eV. On the other hand, if the band gap is less than 3.0 eV, the semiconductor layer 131 cannot transmit visible rays.

A gate insulating layer 132 of the transparent TFT 130 is formed on the transparent semiconductor layer 131 to insulate the semiconductor layer 131 from the source and drain electrodes 135a and 135b. The gate insulating layer 132 is formed of an oxide film, a nitride film, or a transparent insulating material. However, the present invention is not limited to the above.

A gate electrode 133 of the transparent TFT 130 is formed on the gate insulating layer 132. The gate electrode 133 is formed on a channel region (not shown) of the transparent semiconductor layer 131 in a predetermined pattern. The gate electrode 131 can be formed of Indium Tin Oxide (ITO), Indium Zinc Oxide (IZO), Indium Tin Zinc Oxide (ITZO), or Indium Cesium Oxide (ICO) that are either a transparent or semi-transparent metal. However, the present invention is not limited to the above.

An interlayer insulating layer 134 of the transparent TFT 130 is formed on the gate electrode 133. The insulating material of the interlayer insulating layer 134 can be formed of the same material as the gate insulating layer 132.

The source and drain electrodes 135a and 135b of the transparent TFT 130 are formed on the interlayer insulating layer 134 to be electrically connected to both sides of the transparent semiconductor layer 131 through contact holes formed in the gate insulating layer 132 and the interlayer insulating layer 134. The source and drain electrodes 135a and 135b can be formed of either metals having a high conductivity and transparency, such as ITO, IZO, ITZO, and ICO, or semi-transparent metals. However, the present invention is not limited to the above.

The planarization layer 140 is formed on the transparent TFT 130 of a nitride film, an oxide film, or a transparent insulating material. However, the present invention is not limited to the above. A via hole 151a is formed on the planarization layer 140 by etching a region of the planarization layer 140.

The first electrode layer 150 is electrically connected to one of the source and drain electrodes 135a and 135b through the via hole 151a formed on the planarization layer 140.

The pixel defining layer 160 is formed on the first electrode layer 150 to form an aperture 180 that at least partially exposes the first electrode layer 150.

The emission layer 170 is formed in a region on the pixel defining layer 160 and on the aperture 180. The emission layer 170 can further include a hole injecting layer, a hole transporting layer, an electron transporting layer, or an electron injecting layer. In the emission layer 170, holes and electrons injected from the first electrode layer 150 and the second electrode layer 190 are combined with each other to generate light.

The second electrode layer 190 is formed on the emission layer 170 and the pixel defining layer 160. The second electrode layer 190 can be formed of the same metal as the first electrode layer 150.

Figure 2A:
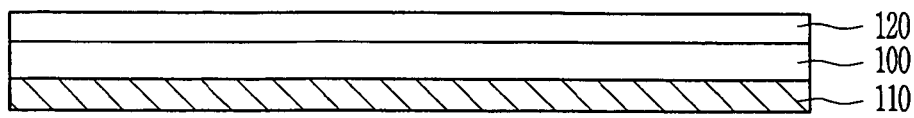
FIGS. 2A to 2C are sectional views of processes of a method of fabricating the OLED according to the first embodiment of the present invention.
Figure 2B:
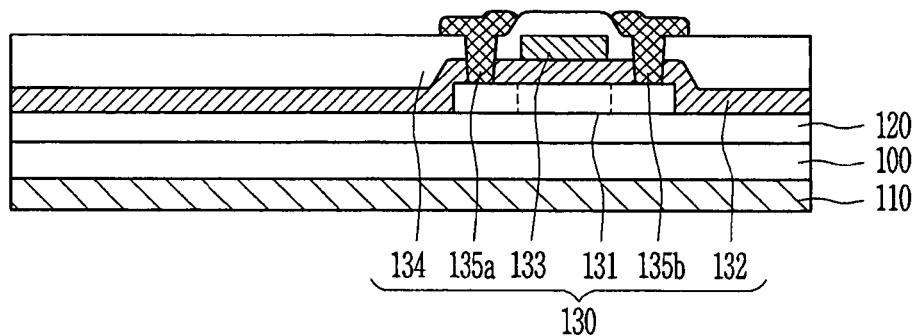
Figure 2C:
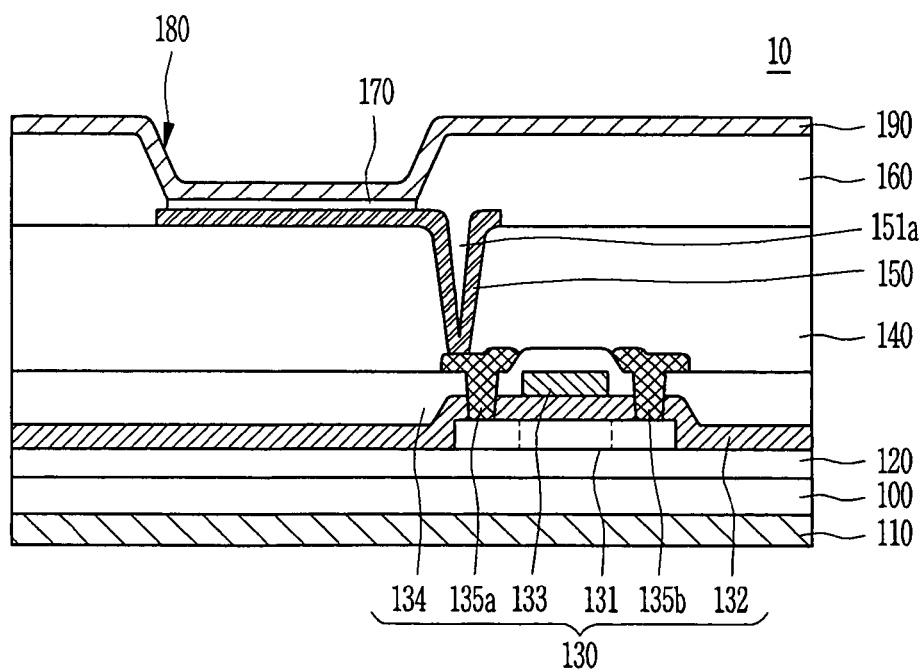

FIGS. 2A to 2C are sectional views of processes of a method of fabricating the OLED according to the first embodiment of the present invention.

First, as illustrated in FIG. 2A, the photochromatic layer 110 is formed on a first surface of the transparent substrate 100 to a predetermined thickness.

To be specific, the photochromatic layer 110 is formed of at least one photochromatic material selected from the group consisting of an inorganic, an organic, and glass materials that visibly change by light. For example, after forming a material, such as $SiO_2$, $Al_2O_3$, $TiO_2$, and ormosils by a sol-gel method, a dopant having an organic photochromic property is penetrated into a porous space to form the photochromatic layer. The sol-gel method is the most effective method to prevent organic molecules, such as $SiO_2$, from being damaged by heat at a low temperature.

The photochromatic material can be applied under the transparent substrate by any common method used in a thin film coating field, such as a spin coating method, a dip coating method, and a spray coating method.

When the photochromatic layer 110 is exposed to light or UV rays, the photochromatic layer 110 absorbs light so that the molecular structure of the photochromatic layer 110 changes to have color. To the contrary, when light becomes weak or indoors where no light source exists, the photochromatic layer 110 becomes transparent. Therefore, when the photochromatic layer 110 is exposed to light or UV rays, the photochromatic layer 110 operates as a black matrix. When the photochromatic layer 110 is exposed to darkness, the photochromatic layer 110 becomes transparent.

The buffer layer 120 is formed on the transparent substrate 100. The buffer layer 120 is obtained by coating the transparent substrate 100 with one material selected from the group consisting of a nitride film, an oxide film, and a transparent insulating material by a Plasma Enhanced Chemical Vapor Deposition (PECVD) method to a thickness of about 3,000 Å.

Then, as illustrated in FIG. 2B, the transparent TFT 130 is formed on the buffer layer.

The transparent semiconductor layer 131 of the transparent TFT is formed on the buffer layer 120 in a predetermined pattern. The transparent semiconductor layer 131 is formed of at least one conductive metal material selected from the group consisting of ZnO, ZnSnO, GaSnO, GaN, and SiC that are wide band gap materials whose band gap is no less than 3.0 eV. The transparent semiconductor layer 131 is obtained by applying a transparent material by a CVD method to a thickness of about 300 Å to 2,000 Å and then, patterning the transparent material in a predetermined shape, for example, an island shape. The transparent semiconductor layer 131 is patterned using an etching mask obtained by applying, exposing, and developing a photoresist (PR).

The transparent semiconductor layer 131 is obtained by applying a transparent material to improve an aperture ratio so that it is possible to relax basic data values required during designing.

According to the above-described embodiment, the transparent semiconductor layer 131 is formed by the CVD method. However, it can be formed by one of a Pulse Laser Deposition (PLD) method, an Atomic Layer Deposition (ALD) method, a sputtering method, or a Molecular Beam Epitaxy (MBE) method.

Then, the gate insulating layer 132 of the transparent TFT 130 is formed on the transparent semiconductor layer 131. The gate insulating layer 132 is obtained by applying an oxide layer, a nitride layer, or a transparent insulating material by the PECVD method to a thickness of about 700 Å to 1,000 Å.

The gate electrode 133 of the transparent TFT 130 is formed on the gate insulating layer 120. To be specific, after depositing a transparent conductive metal, such as ITO, IZO, ITZO, or ICO, or a semi-transparent metal on the gate insulating layer 120 by the sputtering method to a thickness of about 2,000 to 3,000 Å, the metal is patterned in a predetermined shape.

The interlayer insulating layer 134 of the transparent TFT 130 is formed on the gate insulating layer 120 including the gate electrode 130. The interlayer insulating layer 140 can be formed by the same method as that of the gate insulating layer 120.

The source and drain electrodes 135a and 135b of the transparent TFT 130 are formed on the interlayer insulating layer 134 to be electrically connected to both sides of the transparent semiconductor layer 131 through contact holes formed in the gate insulating layer 132 and the interlayer insulating layer 134. Source and drain electrodes 150a and 150b are formed on the transparent semiconductor layer 130 by coating a metal layer with a photoresist to pattern the metal layer in a predetermined shape. The source and drain electrodes 135a and 135b are formed of a metal having a high conductivity and transparency, such as ITO, IZO, ITZO, or ICO, or a semi-transparent metal. However, the present invention is not limited to the above.

Then, as illustrated in FIG. 2C, the planarization layer 140 is formed on the transparent TFT 130.

The first electrode layer 150 is electrically connected to one of the source and drain electrodes 135a and 135b through the via hole 151a formed by etching a region of the planarization layer 140 to expose one of the source and drain electrodes 135a and 135b.

The pixel defining layer 160 is formed on the first electrode layer 150 and the aperture that at least partially exposes the first electrode layer 150 is formed on the planarization layer 140. The pixel defining layer 160 is formed to a thickness of 500 to 3,000 Å.

The emission layer 170 is formed in a region on the pixel defining layer 160 and on the aperture 180. The emission layer 150 can be formed of at least one single layer or a plurality of multi-layers selected from among a hole injecting layer, a hole transporting layer, an emission layer, a hole suppressing layer, an electron transporting layer, and an electron injecting layer.

The second electrode layer 190 is formed on the emission layer 170. The OLED of the above structure emits light by the following emission principle. First, holes injected from the first electrode layer 150 and holes generated by the second electrode layer 190 are combined with each other in the emission layer 170 to generate excitons. According as the exited exitons are changed to be in a base state, the fluorescent molecules of the emission layer emit light.

Figure 3:
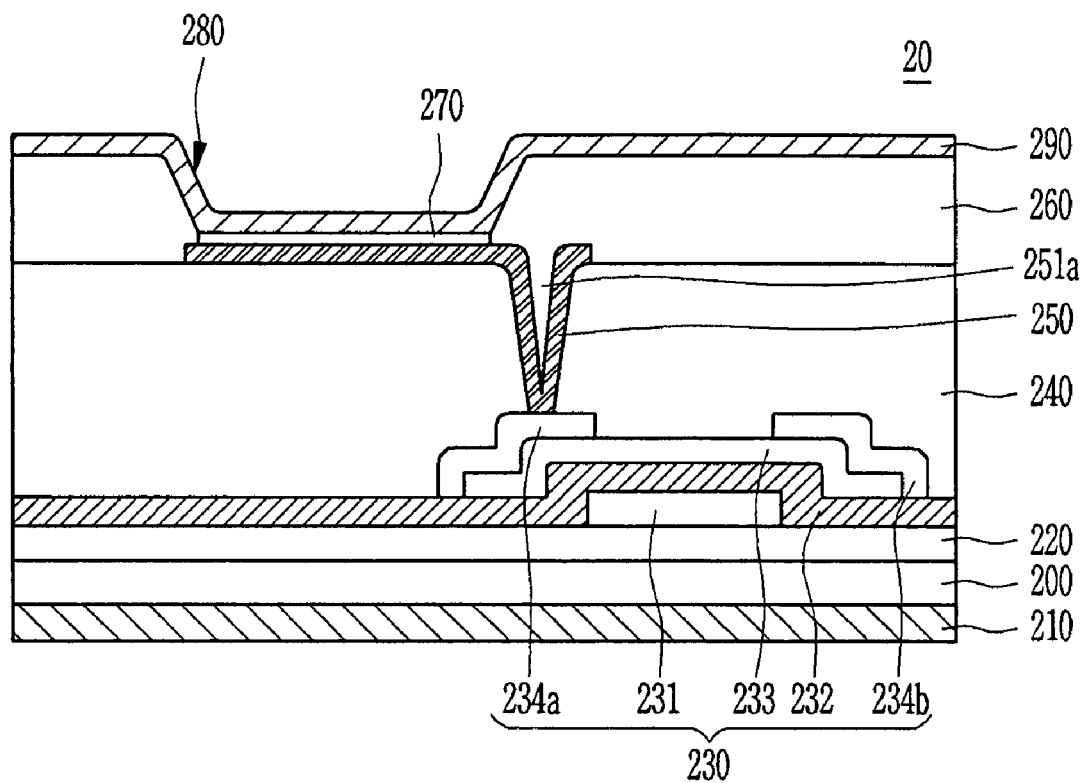
FIG. 3 is a schematic sectional view of an Organic Light Emitting Display (OLED) according to a second embodiment of the present invention.

FIG. 3 is a schematic sectional view of an organic light emitting display according to a second embodiment of the present invention.

Referring to FIG. 3, an OLED 20 includes a transparent substrate 200, a photochromatic layer 210 formed on a first surface of the transparent substrate 200, at least one transparent Thin Film Transistor (TFT) 230 formed on a second surface of the transparent substrate 200, and an organic light emitting device formed on and electrically connected to the transparent TFT 230.

The transparent substrate 200 can be formed of an insulating material, such as glass, plastic, silicon, or a synthetic resin, and is preferably a transparent substrate, such as a transparent glass substrate.

The photochromatic layer 210 is formed on a first surface of the transparent substrate 200 of at least one of inorganic, organic, and glass materials that visibly change by light. In particular, the photochromatic layer 210 is preferably formed of a borosilicate containing Ag or halogen compound crystals. When the photochromatic layer 210 is exposed to light or UV rays, the $Cl^-$ ions of the Ag or halogen compound crystals are emitted as electrons so that the emitted electrons reduces $Ag^+$ to change $Cl^-$ and $Ag^+$ into Cl and Ag in a neutral state. Therefore, the photochromatic layer 210 becomes opaque to operate as a black matrix.

The buffer layer 220 is formed on the transparent substrate 200 of a transparent insulating material, such as a nitride film or an oxide film. However, the present invention is not limited to the above.

The transparent TFT 230 has a gate electrode 231 formed on the buffer layer 220 in a predetermined pattern and including Indium Tin Oxide (ITO), Indium Zinc Oxide (IZO), Indium Tin-Zinc Oxide (ITZO), Indium Cesium Oxide (ICO) or an opaque metal. However, the present invention is not limited to the above.

Furthermore, the transparent TFT 230 includes a gate insulating layer 232 formed on the buffer layer 220 having the gate electrode 231 and insulating the gate electrode 231 from a transparent semiconductor layer 233. The gate insulating layer 232 includes an oxide layer, a nitride layer or a transparent insulating material. However, the present invention is not limited to the above.

The transparent semiconductor layer 233 of the transparent TFT 230 is formed on the gate insulating layer 220 in a predetermined pattern. The transparent semiconductor layer 230 includes at least one conductive metal material selected from the group consisting of ZnO, ZnSnO, CdSnO, GaSnO, TlSnO, InGaZnO, CuAlO, SrCuO and LaCuOS that are wide band gap semiconductor material oxides, whose band gap is no less than 3.0 eV, the group consisting of GaN, InGaN, AlGaN, and InGaAlN that are nitrides, or the group consisting of SiC and diamond that are carbides. On the other hand, if the band gap is less than 3.0 eV, the semiconductor layer 233 cannot transmit visible rays.

The transparent TFT 230 includes source/drain electrodes 234a and 234b which are formed on the transparent semiconductor layer 233 to expose a region of the transparent semiconductor layer 233. The source/drain electrodes 234a and 234b include a metal excellent in conductivity and transparency, for example, ITO, IZO, ITXO, ICO or an opaque metal, etc. However, the present invention is not limited to the above.

The planarization layer 240 is formed on the transparent TFT 230 of a nitride film, an oxide film, or a transparent insulating material. However, the present invention is not limited to the above. A via hole 251a is formed on the planarization layer 140 by etching a region of the planarization layer 240.

The first electrode layer 250 is electrically connected to one of the source and drain electrodes 234a and 234b through the via hole 251a formed on the planarization layer 240.

The pixel defining layer 260 is formed on the first electrode layer 250 to form an aperture 280 that at least partially exposes the first electrode layer 250.

The emission layer 270 is formed in a region on the pixel defining layer 260 and on the aperture 280. The emission layer 270 can further include a hole injecting layer, a hole transporting layer, an electron transporting layer, or an electron injecting layer. In the emission layer 270, holes and electrons injected from the first electrode layer 250 and the second electrode layer 290 are combined with each other to generate light.

The second electrode layer 290 is formed on the emission layer 270 and the pixel defining layer 260. The second electrode layer 290 may be formed of the same metal as the first electrode layer 250.

In the foregoing embodiments, the TFT has a top gate structure (coplanar type) and a bottom gate structure (inverted staggered). However, the present invention is not limited to the above. Alternatively, the thin film transistor can have a staggered structure.

As described above, according to the present invention, the photochromatic layer is formed on a first surface of the transparent substrate of the OLED so that it is possible to realize a light emitting display having high visibility and contrast even when intense external light is incident and to realize the two side emission of the OLED whose emission efficiency is improved. Also, the OLED according to the present invention can be applied to an image display device and various displays.

Although the exemplary embodiments of the present invention have been disclosed for illustrative purposes, those skilled in the art will appreciate that various modifications, additions and substitutions are possible, without departing from the scope and spirit of the present invention as recited in the accompanying claims.

What is claimed is:

1. An Organic Light Emitting Display (OLED), comprising:
    a transparent substrate;
    a photochromatic layer arranged on a first surface of the transparent substrate;
    at least one transparent Thin Film Transistor (TFT) arranged on a second surface of the transparent substrate; and
    an organic light emitting device arranged on and electrically connected to the transparent TFT,
    wherein said first surface of the transparent substrate and said second surface of the transparent substrate are on opposite sides of said transparent substrate.

2. The OLED as claimed in claim 1, wherein the photochromatic layer comprises at least one of an inorganic material an organic material, and a glass material that visibly changes in response to light.

3. The OLED as claimed in claim 2, wherein the photochromatic layer comprises a borosilicate containing either Ag or halogen compound crystals.

4. The OLED as claimed in claim 1, wherein the color of the photochromatic layer changes in response to being exposed to either light or UV rays.

5. The OLED as claimed in claim 1, wherein the transparent TFT comprises a semiconductor layer, a gate electrode, and source and drain electrodes.

6. The OLED as claimed in claim 5, wherein the semiconductor layer comprises a material having a wide band gap of at least 3.0 eV.

7. The OLED as claimed in claim 5, wherein the semiconductor layer comprises one of: an oxide, including ZnO, ZnSnO, CdSnO, GaSnO, TlSnO, InGaZnO, CuAlO, SrCuO or LaCuOS; a nitride including GaN, InGaN, AlGaN or InGaAlN; a carbide including SiC: and diamond.

8. The OLED as claimed in claim 5, wherein the gate electrode and the source and drain electrode comprise one of Indium Tin Oxide (ITO), Indium Zinc Oxide (IZO) and Indium Tin Zinc Oxide (ITZO).

9. The OLED as claimed in claim 1, wherein the organic light, emitting device comprises a first electrode layer, an emission layer and a second electrode layer.

10. The OLED as claimed in claim 9, wherein the first electrode layer and the second electrode layer comprise transparent electrodes.

11. The OLED as claimed in claim 10, wherein the first electrode layer and the second electrode layer comprise one of ITO, IZO and ITZO.

12. The OLED as claimed in claim 1, wherein the organic light emitting device effects two sided emission.

13. A method of fabricating the Organic Light Emitting Display (OLED) defined by claim 1, the method comprising:
    forming a photochromatic layer on a first surface of a transparent substrate;
    forming at least one transparent Thin Film Transistor (TFT) on a second surface of the transparent substrate, the first surface of the transparent substrate and the second surface of the transparent substrate being on opposite sides of the transparent substrate; and
    forming an organic light emitting device on the transparent TFT and electrically connecting the organic light emitting device to the transparent TFT.

14. The method as claimed in claim 12, wherein the photochromatic layer is formed by a sol-gel method.

15. An OLED fabricated according to the process of claim 13, wherein the photochromatic layer comprises at least one of an inorganic material, an organic material and a glass material that visibly changes in response to light.

16. An OLED fabricated according to the method of claim 13, wherein the photochromatic layer comprises a borosilicate containing either Ag or halogen compound crystals.

17. An OLED fabricated according to the method of claim 13, wherein the transparent TFT comprises a semiconductor layer, a gate electrode, and source and drain electrodes.

18. An OLED fabricated according to the method of claim 13, wherein the semiconductor layer comprises a material having a wide band gap of at least 3.0 eV.

* * * * *